United States Patent [19]

Harrington

[11] 3,940,720
[45] Feb. 24, 1976

[54] RECIRCULATING ELECTRIC AND ACOUSTIC TAPPED DELAY LINE

[75] Inventor: John B. Harrington, Los Alamitos, Calif.

[73] Assignee: Hughes Aircraft Company, Culver City, Calif.

[22] Filed: May 2, 1974

[21] Appl. No.: 466,426

[52] U.S. Cl................. 333/30 R; 310/8.1; 333/72; 340/173 R
[51] Int. Cl.²... H03H 9/26; H03H 9/30; H03H 9/32
[58] Field of Search...................... 333/30 R, 72, 29; 340/173 RC; 310/8, 8.1

[56] References Cited
UNITED STATES PATENTS

| | | | |
|---|---|---|---|
| 3,520,000 | 7/1970 | Spruth | 333/29 X |
| 3,701,147 | 10/1972 | Whitehouse | 340/173 RC |
| 3,836,876 | 9/1974 | Marshall et al. | 333/30 R |

Primary Examiner—Eli Lieberman
Assistant Examiner—Marvin Nussbaum
Attorney, Agent, or Firm—W. H. MacAllister; Walter J. Adam

[57] ABSTRACT

The recirculating tapped delay line in accordance with the invention is a combination electrical and acoustic recirculation network that includes a selected number of acoustic surface wave circulating subloops included in an electrical primary feedback loop or network with each subloop having a selected number of taps. Each acoustic subloop includes track changing multistrip couplers that inject the signal into the loop, multistrip reflecting track changers at each end of the surface wave path, tapping transducers or multistrip couplers in both forward and reverse acoustic paths and a multistrip loop cancelling switch for suppressing the recirculating signal as desired. Because the recirculation is entirely acoustic in each subloop, the components which contribute substantially to distortion are utilized with less frequency so that the overall distortion after specific storage time is reduced. Also, by repeated recirculation through each subloop, a substantially larger effective number of taps may be realized per actual number of taps during each electrical feedback around the primary overall loop. The combination of primary and subloops in accordance with the invention effectively multiplies the actual number of taps in the subloops by the number of combined acoustic and electrical recirculations, all with a minimum of signal loss and distortion.

8 Claims, 4 Drawing Figures

RECIRCULATING ELECTRIC AND ACOUSTIC TAPPED DELAY LINE

BACKGROUND OF THE INVENTION

1. Field of the Invention

This invention relates to delay lines and particularly to a recirculating tapped delay line network having a primary electric loop with a selected number of acoustic subloops with the transfer of the signal between the different loops being controlled to provide a maximum number of effective taps with a substantially small amount of signal loss and distortion.

2. Description of the Prior Art

Conventionally, recirculating storage loops utilize coaxial cable or waveguide for the delay element and electrical feedback with gain to maintain recirculation of the signal. Proposed systems include the newer microwave acoustic delay line devices with electrical feedback for providing the recirculation between the input and the output terminals. Thus, existing recirculating tapped delay line loop configurations consists of a tapped delay line either electromagnetic or acoustic with an electrical feedback circuit to coherently recirculate and store desired signals in order to provide a recirculating storage time in the order of one to several milliseconds. To provide a relatively long storage time along with tap spacings of a fraction of microsecond, a large number of acoustic taps and recirculations are required. With conventional electrical recirculation the signal loss and the distortion provided by the transformation between acoustic and electrical signals substantially limits the number of taps that may be utilized. It would be a substantial advantage to the art to have an improved recirculating tapped delay line that provides a large number of effective taps and a large recirculating storage time, all with a minimum of signal distortion and loss

SUMMARY OF THE INVENTION

The recirculating tapped delay line system in accordance with the invention includes a primary electrical recirculating loop within which are selected number of acoustic recirculating subloops each with total acoustic recirculation through a predetermined number of taps. By providing multiple subloop components which contribute a relatively small amount of distortion and signal loss at the high loss, transducers for converting between electrical and acoustical energy are used with less frequency so that the overall distortion is substantially reduced. Also because of the allowable large number of acoustical recirculations the effective number of taps realized in each subloop is an integer multiple of the actual number of taps. The overall system provides a large number of effective taps by multiplying the actual number of taps by the number of combined acoustic and electrical recirculations, all without increasing the signal distortion and loss. An additional advantage of the system of the invention is that distortion errors will be different in each of the acoustic subloops as well as in the primary loop, resulting in a decorrelation of the overall errors.

It is therefore an object of this invention to provide an improved and simplified recirculating tapped delay line loop system that has a substantially large number of taps and storage time.

It is a further object of this invention to provide an acoustic recirculating tapped delay line system that has a minimum of distortion and signal loss for a selected loop storage time.

It is another object of this invention to provide a combination electrical and acoustical recirculating storage loop that is controlled to provide a maximum signal loop storage time.

It is a still further object of this invention to provide a combination electrical and acoustic tapped recirculating loop that provides a substantial number of effective taps compared to the actual number of taps.

It is a still further object of this invention to provide an acoustic recirculating loop that includes a controlled signal canceller to eliminate the acoustically recirculating signal at selected times.

BRIEF DESCRIPTION OF THE DRAWINGS

These and other objects, features and advantages of the invention itself, will become apparent to those skilled in the art in the light of the following detailed description taken in consideration with accompanying drawings wherein like reference numerals indicate like corresponding parts through the several parts wherein.

DESCRIPTION OF THE PREFERRED EMBODIMENT

Figure 1:
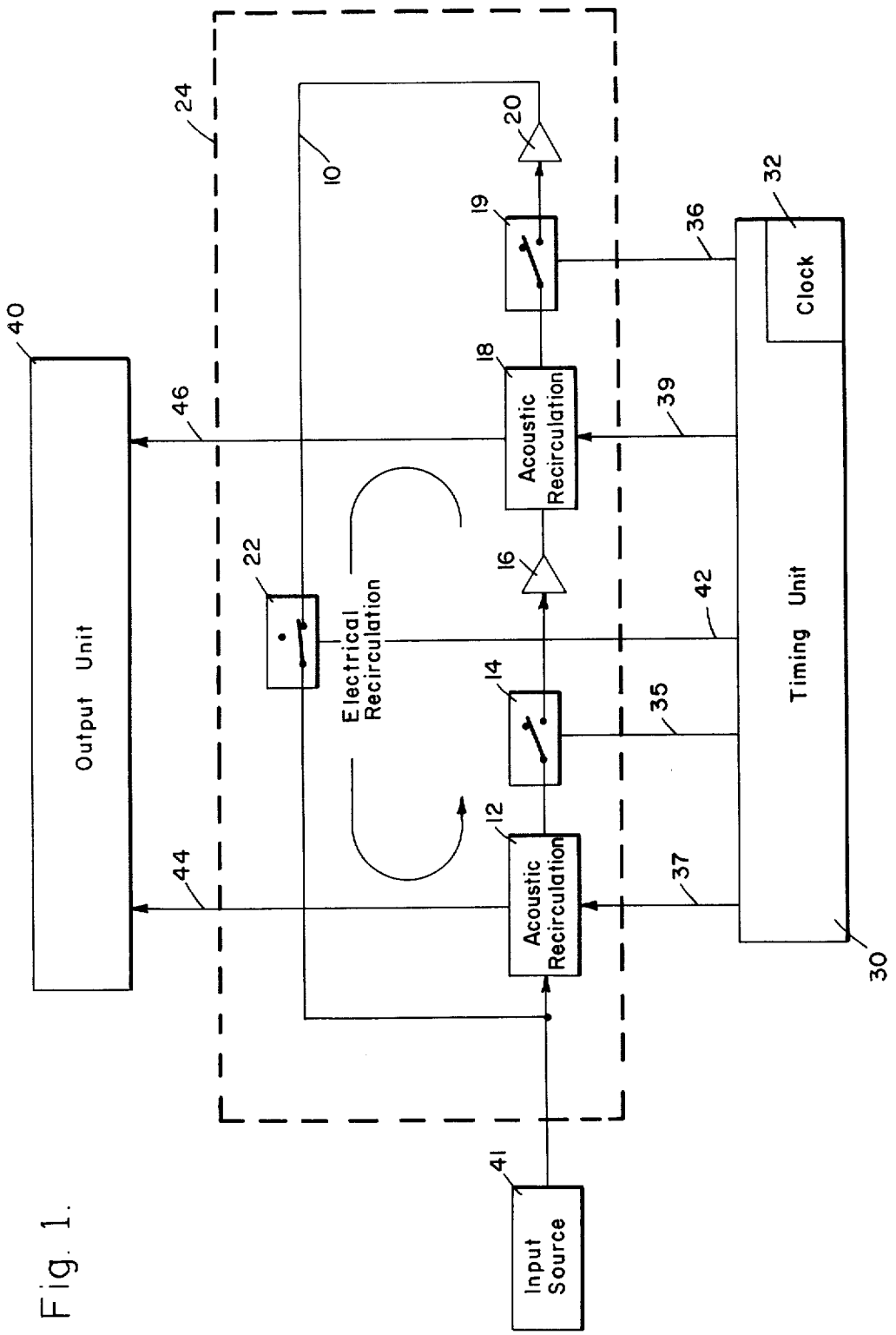
FIG. 1 is a schematic block diagram of the combination electrical and acoustical recirculation network in accordance with the principles of the invention.

Referring first to FIG. 1, the improved electrical and acoustical recirculation network in accordance with the invention includes a first or primary electrical circulation loop 10, in turn including an acoustic recirculating subloop 12, output switch 14, an amplifier 16, an acoustic recirculating subloop 18, an output switch 19, an amplifier 20, and an electrical shutoff switch 22. Although the system is shown with two acoustical recirculating loops 12 and 18, it is to be understood that in accordance with the principle invention, any desired number of recirculating loops may be utilized, each having its own switching arrangement and amplifying arrangements such as output switch 14 and output amplifier 16. The system includes a timing unit 30, an input source 41 and an output unit 40. Although each of the switches 14, 19 and 22 is illustrated schematically as a mechanical switch, it is to be understood that any suitable type of controllable electrical switch may be utilized for the designated switches. The timing unit 30 includes a clock 32 which may be developed to define the tap spacing in microseconds in the acoustic recirculators 12 and 18 and with a suitable gating or clock counting arrangement (not shown) developing a pulse at the end of a predetermined number of recirculations. Switching or gating signals are applied on leads 35 and 36 to respective switches 14 and 19, depending on which recirculating subloop 12 or 18, the signal is being stored, or may be applied to both if signals are being stored in both recirculators. At the same time that the recirculating signal is gated out of a recirculating loop such as 12 or 18, an acoustic shutoff signal is applied on respective leads 37 or 39, or to both leads, to terminate the signal in the acoustic loop by a cancellation arrangement as will be explained subsequently. An overall electrical shutoff signal may be provided on a lead 42 to the electrical shutoff switch 22 to terminate the electrical recirculation. The output unit 40 receives a plurality of tapped signals on a composite lead 44 and on a composite lead 46, each composite lead having a plurality of leads equal to the number of taps in the corresponding acoustic recirculator. An input signal may be supplied to the recirculating loop 12 from the input source 41 or in other arrangements, may be supplied to the subloop 18 or to both subloops as either the same or different signals. The system may receive signals at any frequency within the range of the substrate such as up to several GHz (giga-Hertz).

The system of the invention effectively increases the number of taps over the actual number of taps to provide a large number of taps with a minimum of signal loss. If there are M acoustic recirculations in each of R acoustic recirculating subloops, S electrical recirculations in the primary loop and N taps in each acoustic recirculator 12 or 18, the effective number of taps is equal to (S·R·M·N). The output unit 40 may include a switching arrangement to apply the tapped signals from each recirculating loop to a utilization point or may include any desired type of commutating arrangement to sequentially sample each of the taps received from a selected recirculator during each recirculation of the signal in that recirculator. A large number of taps with a substantially long delay is provided by an acoustical signal are provided in many systems such as in fourier analysis of signal components where the time comparison at various taps is summed at a single point for the analysis.

Another use of the arrangement in accordance with the invention is in a radio frequency oscillator where the signal is delayed and then recirculated back into the oscillator either to a common point or to different points. Another illustrative use of the system of the invention is in radar electronic warfare where range gate pulloff is desired so that when a range gate of another radar system is captured, a controlled delay is utilized to vary the return signal to provide deception to the radar system. In this range gate pulloff arrangement, the delay may be selected by a commutator switchoff.

Figure 2:
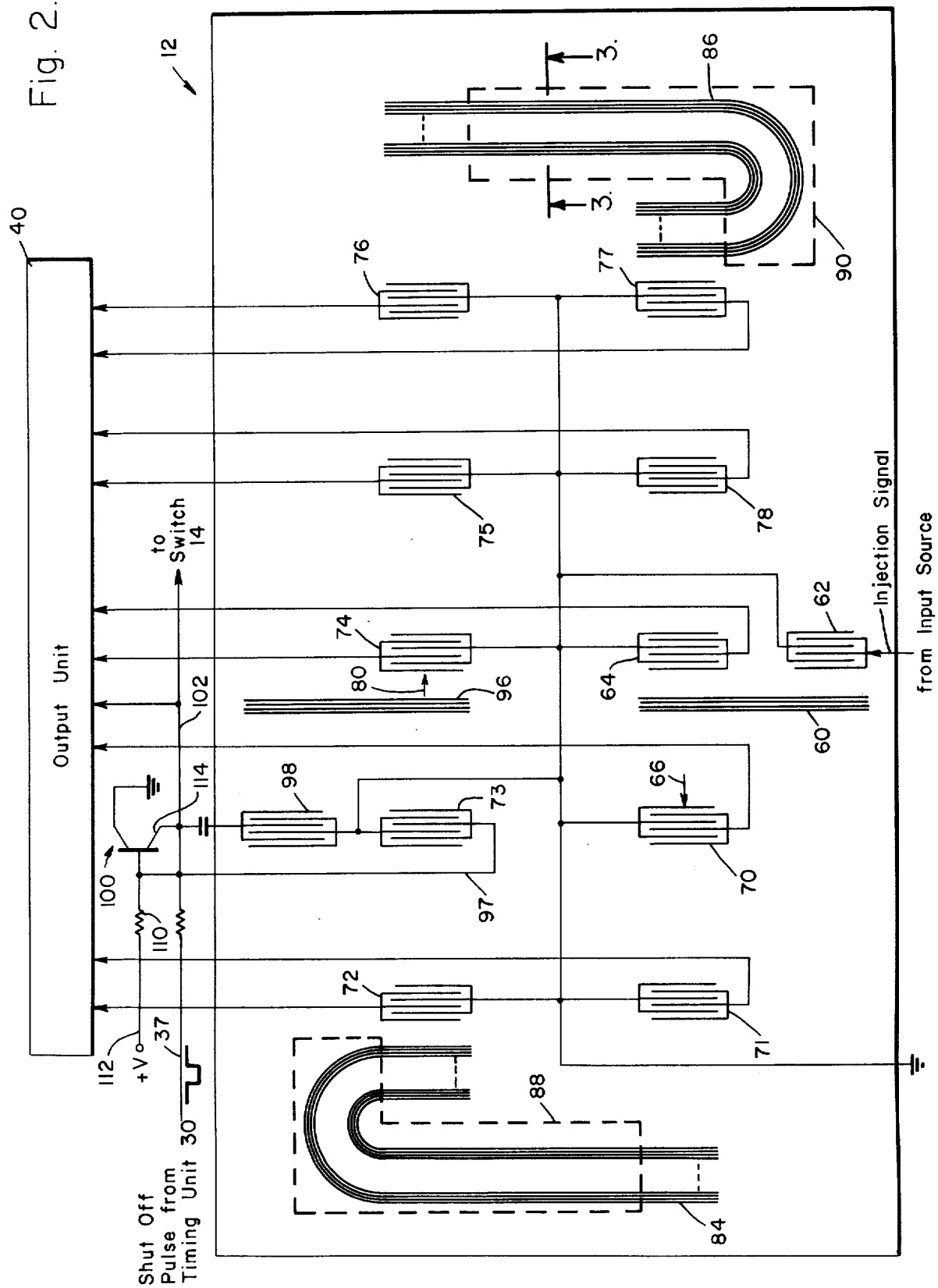
FIG. 2 is a schematic block, circuit and structural diagram for explaining the acoustic recirculating loop in accordance with the invention.

Referring now to FIG. 2 it shows the acoustic recirculating loop 12 in further detail with the surface wave structures mounted on a mounting structure 50 which may be an aluminum frame for example having a suitable piezoelectric substrate 52 which may be any suitable material such as lithium niobate (LiNbO$_3$), quartz, crystal or bismuth germanium oxide (BGO), each cut along the proper axes. It is to be noted that for convenience only the recirculating subloop 12 is shown but other subloops such as 18 may be similar. The acoustic recirculating loop includes a multistrip coupler 60 having a width to provide a full zero db track changer for operation with transducers 62 and 64 positioned adjacent thereto and being of the interdigital type. The transducers 62 and 64 may have the first ends coupled to ground and have the second end of the transducer 62 coupled to the input source and the second end of the transducer 64 coupled to the output unit 40. The input signal applied to the transducer 62 thus changes track in the multistrip coupler 60 and is launched into a surface wave path as indicated by an arrow 66. Taps are provided in the recirculating path by an interdigital transducer 64 as well as by similar transducers 71 to 77, each having one end grounded and the other end coupled to the output unit 40. Thus, two paths for propagation of the surface waves, path 66 and a path 80 are provided with suitable direction changing reflecting multistrip track changers 84 and 86 positioned at each end to maintain a continuously recirculating signal in the acoustical domain. The track changers 84 and 86 may be J shaped multistrip track changers, for example. The multistrip reflecting track changers 84 and 86 have parallel metal strips curved so as to reverse the direction of the acoustic surface waves and are of a type well known in the art such as described in the IEEE Transactions on Microwave Theory and Techniques, Volume MTT-21, Number 4, April 1973, entitled "Surface Acoustic Wave Multistrip Components and Their Application", by Marshall, Newton and Paige. For improved operation the dotted regions 88 and 90 may be of a nonpiezoelectric material so as to reduce the acoustic energy loss while coupling around the bend. Because of the low loss of the recirculating signals, a loop shutoff track changer 96 is provided to cancel the signals once the selected number of recirculations are completed and the signal is removed from a lead 97 at the transducer 73. A transducer 98 is provided to receive the output signal in an inverted form after passing through an amplifier 100 so that cancellation is provided when the signals are received in the track changer 96. The amplifier 100 which may be of any suitable type, may include a transistor 114 of the PNP type having a base coupled to the lead 97, through a suitable resistor to the lead 37 for receiving a shutoff pulse and through a resistor 110 to a +V voltage source 112. The transistor 114 has its emitter coupled to the ground and its collector coupled through a suitable coupling capacitor to the other end of the coupling transducer 98. The transistor 114 is normally biased out of conduction by the +V voltage source 112, but in the presence of a negative pulse on the lead 37, is biased into conduction to pass the signal from the lead 97 to its collector and into the transducer 98. It is noted that because the output signal is derived from the lead 97 on a lead 102 a delay is not required prior to applying the shutoff pulse to the lead 37. Any phase shifts provided by the loop track changer or injection multistrip coupler or by other elements may be compensated by shifting the position of the transducers, as is well known in the art.

Figure 3:
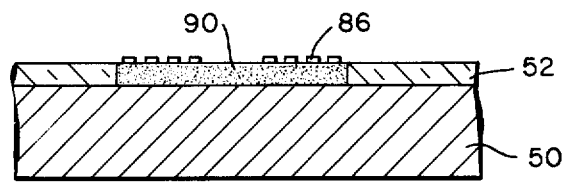
FIG. 3 is a cross section taken at line 33 of FIG. 2 for further explaining the arrangement of the reflecting track changers that may be utilized in the acoustic recirculating loop of the invention.

Referring now also to FIG. 3, the sectional view shows the non-piezoelectric region 90 which is provided to reduce the acoustic energy loss while coupling around the bend of the track changer. Acoustic radiation from the fingers in the portions around the bend results in substantial signal loss unless the dielectric and piezoelectric constant of the substrate medium in that region is minimized to decrease the losses at the high frequencies. The region 90 may be constructed for example, by an ultrasonic impact grinder to machine the holes or recesses of any desired shape in size into the acoustic substrate material 52. As is well known, an impact grinder operates by vibrating a cutting tool against a crystal or lithium niobate substrate in the presence of a carborundum cutting compound. The resulting abrasive action will cut through a hundred mill substrate for example, in the matter of approximately one minute. Since the shape of the hole is determined by the contours of the cutting tool, any shape that can be machined in a hard steel cutting tool may be cut into the substrate 52. After the recess or hole is cut into the substrate it is filled with an epoxy casting resin or other suitable non-piezoelectric material and ground and polished so that the entire surface is smooth in passing from the acoustic substrate to the filled in areas. The multistrip coupler structures of the track changer 86 may be any suitable deposited material such as aluminum, silver or gold and may be formed on a smooth surface by conventional photographic and vacuum deposition techniques.

The vacuum deposition of all of the conductive elements on the substrate 52 may be of any suitable procedure such as the following:
1. Polish the substrate surface on a suitable machine.
2. Form a mask having openings where metal is to be formed.
3. Dip the substrate structure into photoresist, dry.
4. Position mask on substrate surface, expose to light.
5. Remove mask and develop photoresist.
6. Rinse in water to rinse away photoresist at future metal positions.
7. Vacuum deposit the metal on the surface of the substrate.
8. Soak the substrate in acetate and photoresist peels off leaving metal lines.

Figure 4:
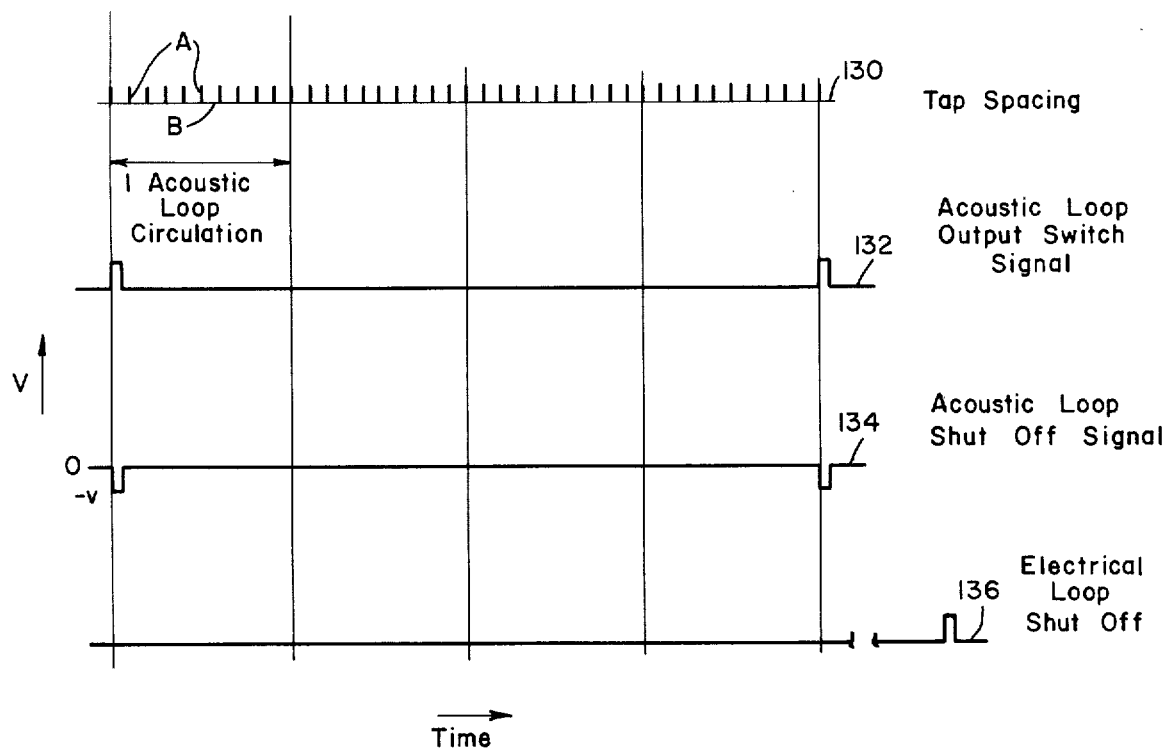
FIG. 4 is a schematic diagram of waveforms of voltage as a function of time for further explaining the operation of the tapped delay system in accordance with the invention.

Referring now to FIG. 4 as well as to FIGS. 1 and 2, the tap spacing as shown by waveform 130 may be determined and pulses provided by the clock 32 having a clock pulse spacing similar to that of the waveform 130. It is to be noted that in the illustrated arrangement shown by the waveform 130 with ten taps in the acoustic subloop, 4 recirculations are provided for each signal applied thereto. At the end of 4 recirculations acoustic loop output switch signals of a waveform 132 are applied to the switch such as 14 to pass the signal to the amplifier 16 and into the second acoustic circulating loop 18. At substantially the same time as the pulse of the wave 132, an acoustic loop shutoff signal of a wave 134 is applied to the base of the transistor 114 for cancelling the signal circulating around the loop. It is to be noted that the cancellation and the outputting of the signal occurred at the same time so it is not necessary to provide a delay after cancellation. If interlacing of signals is desired in any acoustic subloop, the signals A of the waveform 130 may be taken from the taps and signals B may be taken from the same taps by injecting the signals in the subloop at half tap spacing intervals. A similar operation is provided in the other acoustic recirculator 18 controlled by signals similar to those of waveforms 130, 132 and 134. The electrical loop shutoff signal of waveform 136 is shown to illustrate that the entire electrical recirculation system may be reenergized when desired.

To illustrate the advantage of the system of the invention, a reasonable loss through each reflecting track changer would be about 2db and the loss through each tap would be about 1db. Each signal may be circulated through a relatively small number of taps such as 10 taps a selected number of times such as 4, for example. For approximately a millisecond storage time and 16 microseconds storage time for two subloops (2 microseconds per tap), 70 electrical recirculations are required. The acoustic loss for 10 taps for a 0.2 microsecond tap spacing, is 10db, and for 2 track changers is 4db, and the propagation loss is 1db. If the output is 70db below the input for a subloop and 15db loss per recirculation with 6db loss for each of the input and for the output transducers, 4 recirculations are allowed in the acoustic subloop. The effective number of taps per subloop is 40. Thus, the tapping transducer loss for converting the signal between acoustic and electrical energy which may be as high as 6db is avoided during the acoustic recirculations. In the conventional acoustic delay line with 0.2 microsecond tap spacing, 500 taps would be required to provide 1 millisecond delay.

Thus the system, in accordance with the invention utilizes an electrical primary loop and a selected number of acoustic subloops to minimize the number of required taps. The actual number of taps may be relatively small but the effective number of taps is the actual number of taps multiplied by the number of combined acoustic and electrical recirculations. This system has the advantage also of providing a decorrelation of overall errors because the distortion errors, if present, will be different in each of the subloops.

What is claimed is:

1. A recirculating tapped delay line system comprising
    a selected number of acoustic recirculating means each having a selected number of taps;
    electrical recirculating means coupling said acoustic recirculating means in series and in a continuous loop; and
    switching means coupled in the loop of said electrical circulating means at the output of each acoustic recirculating means for controlling the number of recirculations in each acoustic recirculating means.

2. The system of claim 1 in which each acoustic recirculating means includes signal cancelling means for terminating the recirculating acoustic signal.

3. The system of claim 2 further including control means for energizing said signal cancelling means substantially when said switching means is energized.

4. The combination of claim 3 further including an input source coupled to a selected one of said acoustic circulating means.

5. The combination of claim 4 in which said acoustic circulating means includes a substrate having first and second surface wave paths, multistrip track changers at both ends of said paths for providing a continuous acoustic signal path, with said selected number of taps and said signal cancelling means being positioned in said continuous signal path.

6. An acoustical recirculating loop comprising
    a piezoelectric substrate providing first and second acoustical paths, each having first and second ends, and first and second direction changing and multistrip J-shaped track changers positioned at respective first and second ends of said first and second paths for transferring acoustic signals from one path to the other to provide a continuous path, said continuous path having a selected number of taps of interdigital transducers, and
    controllable signal canceller means positioned in said continuous path.

7. The combination of claim 6 in which said canceller means includes first and second interdigital transducer means positioned on said substrate with each having an end adjacent to an end of the other with said first transducer means positioned in said continuous path;
    a track changer positioned adjacent to and parallel to said first and second transducers; and amplifying means coupled between the said first and second transducer means to transmit to said track changer from said second transducer an inverted form of a signal transmitted to said track changer from said first transducer.

8. An acoustical signal canceller for cancelling a surface wave signal passing in a path on a piezolectric substrate comprising:

first and second coupler means positioned in a substantially linear relation with each having first and second ends and with said first coupler means positioned in said path to receive said surface wave signals;

track changing means positioned on said substrate substantially parallel to said first and second coupler means with a first portion in said path to receive signals from said first first coupler means and a second portion adjacent to said path to receive signals from second coupler means; and means coupling selected ends of said first and second couplers to apply a signal from said first to said second coupler so as to be transmitted from said second coupler to said track changer inverted from the signal transmitted from said first coupler to said track changer.

* * * * *